US 6,637,231 B1

(12) United States Patent
Monfarad

(10) Patent No.: US 6,637,231 B1
(45) Date of Patent: Oct. 28, 2003

(54) FIELD REPLACEABLE PACKAGED REFRIGERATION HEAT SINK MODULE FOR COOLING ELECTRONIC COMPONENTS

(75) Inventor: Ali Heydari Monfarad, Albany, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/187,223

(22) Filed: Jun. 28, 2002

(51) Int. Cl.[7] .............................. F25D 23/12; F28F 7/00
(52) U.S. Cl. ...................................... 62/259.2; 165/80.2
(58) Field of Search ................... 62/115, 118, 114, 62/259.2, 467, 498; 165/80.2

(56) References Cited

U.S. PATENT DOCUMENTS

| | | | |
|---|---|---|---|
| 4,313,310 A | 2/1982 | Kobayashi et al. | 62/175 |
| 4,434,625 A | 3/1984 | Cree | 62/199 |
| 4,846,861 A | 7/1989 | Berry et al. | 62/6 |
| 5,365,749 A | 11/1994 | Porter | 62/259.2 |
| 5,693,991 A | 12/1997 | Hiterer et al. | 310/30 |
| 5,715,693 A | 2/1998 | van der Walt et al. | 62/198 |
| 5,884,692 A | 3/1999 | Lee et al. | 165/80.3 |
| 5,963,425 A | 10/1999 | Chrysler et al. | 361/695 |
| 5,982,618 A * | 11/1999 | Roos | 361/695 |
| 5,993,178 A | 11/1999 | Park et al. | 417/545 |
| 6,034,872 A | 3/2000 | Chrysler et al. | 361/699 |
| 6,035,655 A | 3/2000 | Hare et al. | 62/259.2 |
| 6,038,874 A | 3/2000 | van der Walt et al. | 62/198 |
| 6,044,660 A | 4/2000 | Numoto et al. | 62/468 |
| 6,054,676 A | 4/2000 | Wall et al. | 219/209 |
| 6,079,960 A | 6/2000 | Funatsu et al. | 417/488 |
| 6,089,836 A | 7/2000 | Seo | 417/417 |
| 6,138,459 A | 10/2000 | Yatsuzuka et al. | 62/6 |
| 6,250,895 B1 | 6/2001 | Kawahara et al. | 417/363 |
| 6,398,523 B1 | 6/2002 | Hur et al. | 417/417 |

* cited by examiner

*Primary Examiner*—Henry Bennett
*Assistant Examiner*—Malik Drake
(74) *Attorney, Agent, or Firm*—Gunnison, McKay & Hodgson, L.L.P.; Philip J. McKay

(57) ABSTRACT

A field and/or customer replaceable packaged refrigeration heat sink module is suitable for use in standard electronic component environments. The field replaceable packaged refrigeration heat sink module is self-contained and is specifically designed to have physical dimensions similar to those of a standard air-based cooling system, such as a fined heat sink or heat pipe. As a result, the field replaceable packaged refrigeration heat sink module can be utilized in existing electronic systems without the need for board or cabinet/rack modification or the "plumbing" associated with prior art liquid-based cooling systems.

37 Claims, 4 Drawing Sheets

FIELD REPLACEABLE PACKAGED REFRIGERATION HEAT SINK MODULE FOR COOLING ELECTRONIC COMPONENTS

RELATED APPLICATION

This application claims the benefit of U.S. Provisional Application No. 60/316,626 filed Aug. 30, 2001, entitled "Refrigeration System for Electrical Components" and naming Ali Heydari and Eric Olsson as inventors, which is incorporated herein by reference in its entirety.

FIELD OF THE INVENTION

The present invention relates to a refrigeration system for cooling electrical components. More particularly, the invention relates to a field and/or customer replaceable refrigeration module that is suitable for use in standard electronic component environments.

BACKGROUND OF THE INVENTION

Electronic components, such as microprocessors and other various integrated circuits, have advanced in at least two significant ways. First, feature sizes have moved into the sub-micron range thereby allowing larger numbers of transistors to be formed on a given surface area. This in turn has resulted in greater device and circuit density on the individual chips. Second, in part due to the first advance discussed above, microprocessors have increased dramatically in clock speed. At present microprocessor speeds of 2.5 Gigahertz are coming to market and the 3 and 4 Gigahertz range is rapidly being approached.

As a result of the advances in device density and microprocessor speed discussed above, heat dissipation, which has always been a problem in the past, is rapidly becoming the limiting factor in microprocessor performance. In addition, the market for electronic devices currently demands smaller and smaller devices with more capabilities and longer battery, or remote/mobile location, operational capability. Consequently, heat dissipation and cooling is now the foremost concern and the major obstacle faced by system designers.

As noted, heat dissipation has long been recognized as a serious problem limiting the performance of electronic components and systems. In the past, the solutions to the heat dissipation problem have been mostly limited to air-based cooling systems, with only the most exotic military, scientific and custom electronic systems employing the bulky and costly prior art liquid-based cooling solutions.

In the prior art, air-based cooling systems, such as heat sinks, cooling fins, heat pipes and fans, have been the systems of choice for several reasons. First, the air-based cooling systems of the prior art were modular and self-contained and were therefore field replaceable with minimal effort using standard tools. Second, the prior art air-based cooling systems attached directly to the components that needed cooling and a discrete cooling unit could be provided for each heat source. In addition, air-based cooling systems were compact and simple in both operation and installation, with minimal parts to fail or break and minimal added system complexity. Therefore, prior art air-based cooling systems were reliable. In addition, and probably most importantly, in the prior art, air-based cooling systems could reasonably meet the cooling needs of electronic devices and systems so there was little motivation to move to the more complex and problematic liquid-based systems. However, as noted above, due to the advances in microprocessor speeds and device density, air-based cooling systems will most likely not be a viable option for electronic device cooling for the next generation of microprocessors.

As noted above, another possible prior art cooling system that could potentially provide the level of cooling required by the next generation of microprocessors is liquid-based cooling systems. Prior art liquid-based cooling systems typically used a refrigerant, such as R134, that was circulated by a compressor. In prior art liquid-based cooling systems the compressor was typically a crankshaft reciprocating compressor or a rotary compressor similar to those used in home refrigerators.

As noted above, prior art liquid-based cooling systems have far more potential cooling capability than air-based systems. However, in the prior art liquid-based cooling systems, the crankshaft reciprocating or rotary compressors were typically, by electronics industry standards, very large, on the order of tens of inches in diameter, very heavy, on the order of pounds, and often required more power to operate than the entire electronic system they would be charged with cooling. In addition, the size and design of prior art liquid-based cooling systems often required that the major components of the prior art liquid-based cooling system be centrally located, typically remote from the electronic devices to be cooled, and that a complicated system of tubing or "plumbing" be used to bring the cooling liquid into thermal contact with the heat source, i.e., with the microprocessor or other integrated circuit. Consequently, unlike prior art air-based cooling systems, prior art liquid-based cooling systems were not modular, were not self-contained, and often required special expertise and tools for maintenance and operation. In addition, unlike the prior art air-based cooling systems discussed above, prior art liquid-based cooling systems did not attach directly to the components that needed cooling and a discrete cooling unit typically could not be provided for each heat source. Also, unlike the prior art air-based cooling systems discussed above, prior art liquid-based cooling systems were not compact and were not simple in either operation or installation. Indeed, prior art liquid-based cooling systems typically included numerous parts which could potentially fail or break. This added complexity, and threat of component failure, was particularly problematic with respect to the associated plumbing discussed above because a failure of any of the tubes could result in the introduction of liquid refrigerant into, or onto, the electronic devices and could cause catastrophic system failure.

In addition, prior art liquid-based cooling systems employed compressors that typically were highly orientation dependent, i.e., they could not operate at angles of more than 30 or 40 degrees. Consequently, prior art liquid based cooling systems were particularly ill suited for the electronics industry that stresses flexibility and often requires orientation independent operation.

Given that, as discussed above, air-based cooling systems have reached their operational limits when it comes to cooling electronic components, there is a growing realization that some other form of cooling system, such as liquid-based cooling systems will need to be adopted by the electronics industry. However, as discussed above, prior art liquid-based cooling systems are far from ideal and, thus far, the industry has not adopted liquid-based cooling in any meaningful way because the problems associated with prior art liquid-based cooling systems are still thought to outweigh the advantages these systems provide in terms of increased cooling capacity.

What is needed is a cooling system that has the cooling capacity of a liquid-based cooling system yet has the advantages of being modular, simple, and compact like air-based cooling systems.

SUMMARY OF THE INVENTION

The present invention is directed to a field and/or customer replaceable packaged refrigeration heat sink module that is suitable for use in standard electronic component environments. According to the present invention, advances in compressor technology are incorporated in a field replaceable packaged refrigeration heat sink module to be used for cooling electronic components. The field replaceable packaged refrigeration heat sink module is self-contained and is specifically designed to have physical dimensions similar to those of a standard air-based cooling system, such as a fined heat sink or heat pipe. As a result, the present invention can be utilized in existing electronic systems without the need for board or cabinet/rack modification or the "plumbing" associated with prior art liquid-based cooling systems. Indeed, unlike prior art liquid-based cooling systems, the various parts of the field replaceable packaged refrigeration heat sink module of the invention, including the very minimal tubing, are self-contained in the field replaceable packaged refrigeration heat sink module and therefore a failure of any of the tubes would typically not result in the introduction of liquid into, or onto, the electronic devices and would not cause catastrophic system failure, as was the risk with prior art liquid-based cooling systems.

The field replaceable packaged refrigeration heat sink module of the present invention is a modified liquid-based cooling system and therefore provides the cooling capacity of a prior art liquid-based cooling systems. However, unlike prior art liquid-based cooling systems, the field replaceable packaged refrigeration heat sink module of the invention is modular and self-contained and is therefore field and/or customer replaceable with minimal effort using standard tools. In addition, unlike prior art liquid-based cooling system, the field replaceable packaged refrigeration heat sink module of the invention is capable of being attached directly to the components that need cooling and, in one embodiment of the invention, a discrete field replaceable packaged refrigeration heat sink module of the invention can be provided for each heat source. In addition, unlike prior art liquid-based cooling systems, the field replaceable packaged refrigeration heat sink module of the invention is compact and simple in both operation and installation, with minimal parts to fail or break and minimal added complexity. Therefore, unlike prior art liquid-based cooling systems, the field replaceable packaged refrigeration heat sink module of the invention is sturdy and reliable.

In addition, the field replaceable packaged refrigeration heat sink module of the present invention is self contained and specifically designed to be operational in any orientation. Consequently, unlike prior art liquid-based cooling systems, the field replaceable packaged refrigeration heat sink module of the present invention can be mounted, and operated, at any angle. This makes the field replaceable packaged refrigeration heat sink module of the present invention particularly well suited for use with electronic systems.

As discussed briefly above, and in more detail below, the field replaceable packaged refrigeration heat sink module of the present invention has the cooling capacity of a liquid-based cooling system and yet is modular, compact, simple in design and simple to use, like an air-based cooling system. Consequently, the field replaceable packaged refrigeration heat sink module of the present invention can readily meet the cooling needs of the next generation of electronic devices and systems.

BRIEF DESCRIPTION OF THE DRAWINGS

The refrigeration system of the present invention will be described in the following detailed description, with reference to the accompanying drawings. In the drawings, the same reference numbers are used to denote similar components in the various embodiments.

DETAILED DESCRIPTION

Figure 1:
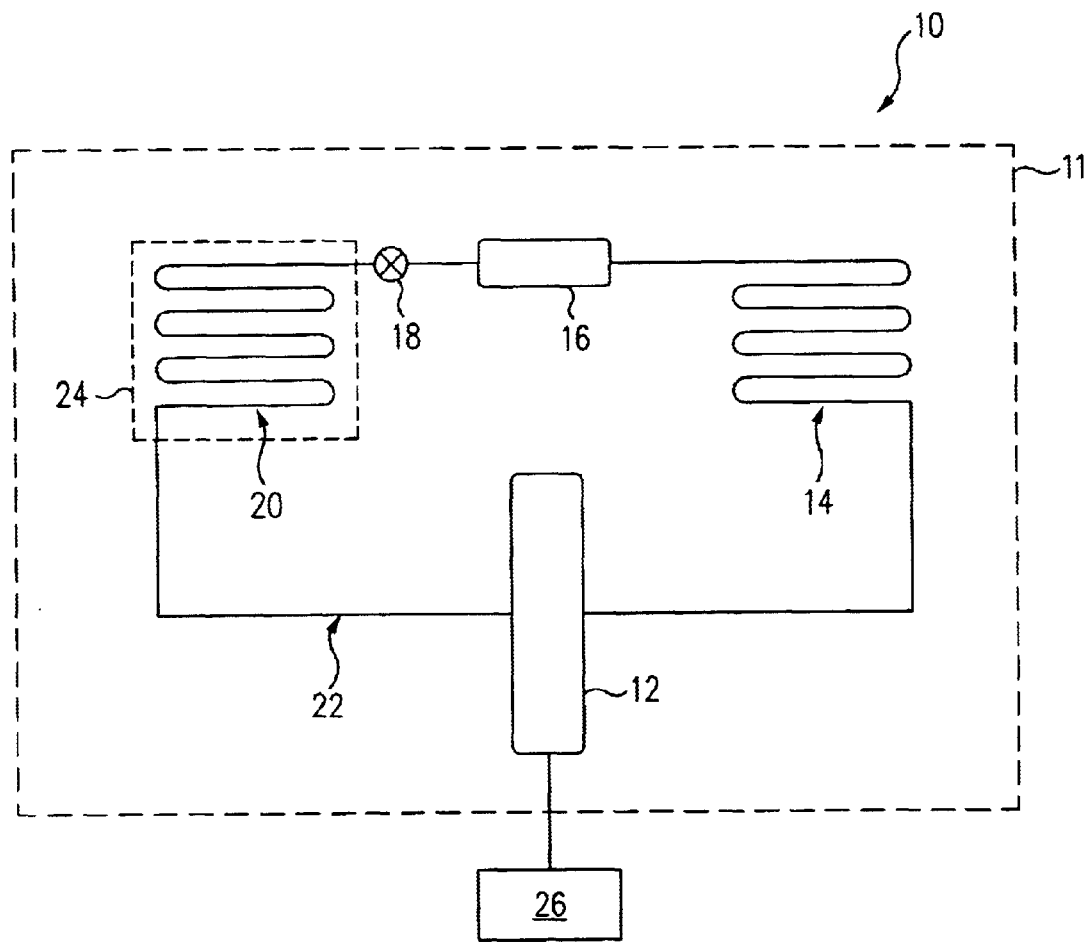
FIG. 1 is a functional diagram of a field replaceable packaged refrigeration heat sink module designed according to the principles of one embodiment of the invention.

The field replaceable packaged refrigeration heat sink module (10 in FIG. 1, 60 in FIGS. 3, 4 and 5) of the present invention has the advantageous cooling capacity of a prior art liquid-based cooling system, yet, unlike prior art liquid-based cooling systems, the field replaceable packaged refrigeration heat sink module of the present invention is suitable for use in standard electronic component environments. According to the present invention, advances in compressor technology are incorporated in a field replaceable packaged refrigeration heat sink module for cooling electronic components. Unlike prior art liquid-based cooling systems, the field replaceable packaged refrigeration heat sink module of the invention is self-contained and is specifically designed to have physical dimensions similar to those of a standard air-based cooling system such as a fined heat sink or heat pipe (not shown). As a result, the present invention can be utilized in existing electronic systems without the need for board or cabinet/rack modification or the "plumbing" (not shown) associated with prior art liquid-based cooling systems. Indeed, unlike prior art liquid-based cooling systems, the various parts of the field replaceable packaged refrigeration heat sink module of the invention, including the very minimal tubing, are self-contained in the field replaceable packaged refrigeration heat sink module and therefore a failure of any of the tubes would typically not result in the introduction of liquid into, or onto, the heat source (24 in FIG. 1, 62 in FIGS. 3, 4 and 5), such as an electronic component, and would therefore not cause the catastrophic electronic system failure that was always the risk with prior art liquid-based cooling systems.

As noted above, the field replaceable packaged refrigeration heat sink module of the invention is a modified liquid-based cooling system and therefore provides the cooling capacity of prior art liquid-based cooling systems. However, unlike prior art liquid-based cooling systems, the field replaceable packaged refrigeration heat sink module of the invention is modular and self-contained and is therefore field and/or customer replaceable with minimal effort using standard tools such as a socket wrench. In addition, unlike prior art liquid-based cooling systems, the field replaceable packaged refrigeration heat sink module of the invention is, in one embodiment, attached directly to the heat source that needs cooling and a discrete field replaceable packaged refrigeration heat sink module of the invention can be provided for each heat source, such as an electronic device or microprocessor. In addition, unlike prior art liquid-based cooling systems, the field replaceable packaged refrigeration heat sink module of the invention is compact and simple, in both operation and installation, with minimal parts to fail or break and minimal added system complexity. Therefore, unlike prior art liquid-based cooling systems, the field replaceable packaged refrigeration heat sink module of the invention is very sturdy and reliable.

FIG. 1 is a functional diagram of a field replaceable packaged refrigeration heat sink module 10 designed according to one embodiment of the invention. Referring to FIG. 1, field replaceable packaged refrigeration heat sink module 10 includes a compressor 12, a condenser 14, an optional receiver 16, an expansion device 18 and an evaporator 20, all of which are connected together in refrigeration loop 22 through which a refrigerant, such as R134, is circulated.

As also shown in FIG. 1, compressor 12, condenser 14, optional receiver 16, expansion device 18 and evaporator 20, in a refrigeration loop 22 are self-contained in field replaceable packaged refrigeration heat sink module 10, as indicated by dashed line 11.

In one embodiment of the invention, evaporator 20 is positioned in thermal contact with a heat source 24, such as an electronic component, that is to be cooled. As is well understood by those of ordinary skill in the art, compressor 12 compresses the refrigerant (not shown) into a high-pressure, high temperature liquid that is then conveyed to condenser 14. At condenser 14, the refrigerant is allowed to cool before being conveyed to receiver 16. From receiver 16, the refrigerant passes through expansion device 18, which may be, for example, a capillary tube, and into evaporator 20. The liquid refrigerant evaporates in evaporator 20 and in the process absorbs heat from heat source 24 to produce the desired cooling effect. From evaporator 20 the refrigerant is drawn back into compressor 12 to begin another cycle through refrigeration loop 22.

In accordance with the present invention, compressor 12 is one of several new generation compressors that are relatively small, on the order of 2.0 inches in diameter and 3 to 4 inches long. In one embodiment of the invention, compressor 12 is less than 1.7 inches in diameter and less than 4 inches long. One example of this new generation of compressors is the relatively new linear compressor now being used in the more standard refrigeration, i.e., non-electronics, industry. In one embodiment of the invention, compressor 12 is a linear compressor whose operation is controlled by drive circuit 26.

Figure 2:
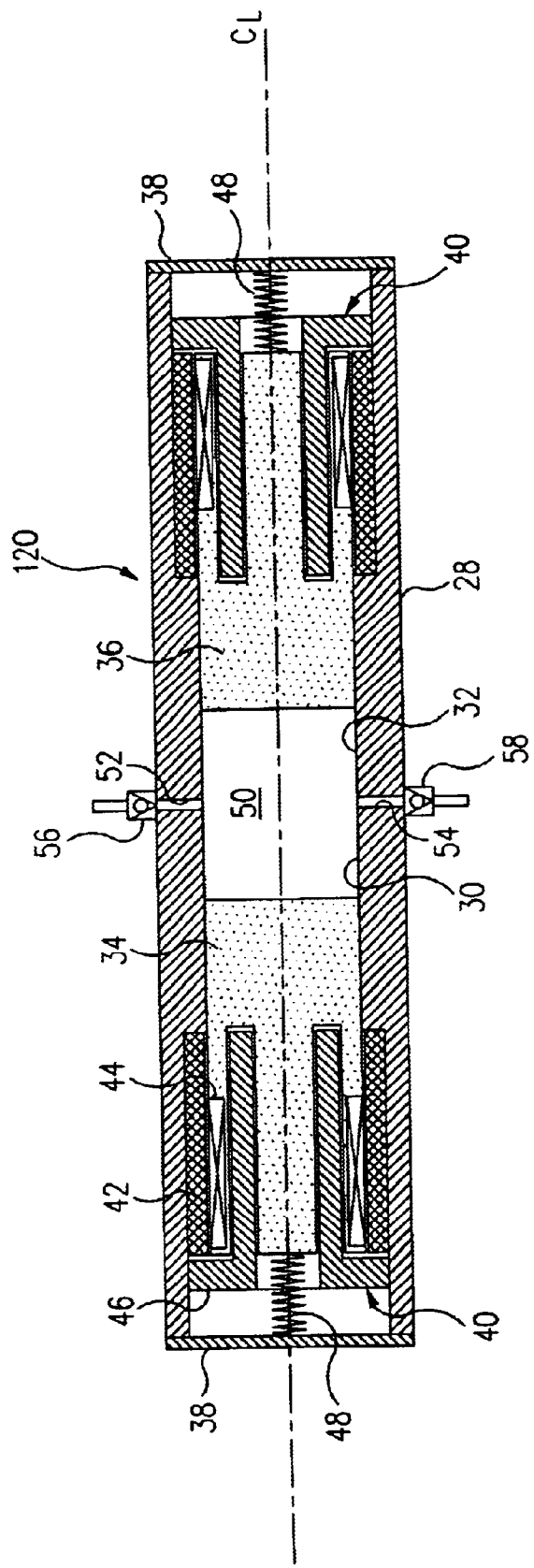
FIG. 2 is a longitudinal cross sectional view of an exemplary linear compressor that may be used in the field replaceable packaged refrigeration heat sink module depicted in FIG. 1 according to the principles of one embodiment of the invention.

As discussed in more detail with respect to FIG. 2, a linear compressor is a positive displacement compressor having one or more free floating pistons that are driven directly by a linear motor. Thus, a linear compressor differs from a conventional reciprocating and rotary compressor where the pistons are driven through a crankshaft linkage, or by a rotary motor through a mechanical linkage, respectively. Since the capacity of any compressor is directly related to the size and displacement of the pistons, a linear compressor can typically be made smaller than a crankshaft reciprocating or rotary compressor but can maintain the same capacity since the displacement of the pistons is not dependent on the size of a mechanical linkage. In addition, since a linear compressor usually comprises fewer moving parts than a crankshaft reciprocating or rotary compressor, the linear compressor is typically quieter than a crankshaft reciprocating or rotary compressor. Furthermore, since the pistons of a double-piston linear compressor move in opposition to one another, the reaction forces of the pistons will cancel each other out and the vibrations that are commonly experienced with crankshaft reciprocating or rotary compressors will consequently be suppressed. Consequently, linear compressors offer many advantages over a crankshaft reciprocating compressor or a rotary compressor for application as compressor 12 in field replaceable packaged refrigeration heat sink module 10.

The linear compressors suitable for use as compressor 12 in field replaceable packaged refrigeration heat sink module 10 can be any of a variety of single, double or multiple-piston linear compressors that are known in the art. For example, in one embodiment of the invention, linear compressor 12 is a single-piston linear compressor of the type disclosed in U.S. Pat. No. 5,993,178, which is hereby incorporated herein by reference, or a double-piston linear compressor of the type disclosed in U.S. Pat. No. 6,089,836 or U.S. Pat. No. 6,398,523, all of which are hereby incorporated herein by reference.

Referring to FIG. 2, an exemplary linear compressor 120, suitable for use as compressor 12 in FIG. 1, comprises a housing 28, first and second cylinders 30, 32 which are connected to, or formed integrally with, housing 28, and first and second pistons 34, 36 which are slidably received within first and second cylinders 30, 32, respectively. The ends of housing 28 are, in one embodiment, hermetically sealed, such as by end plates 38. In addition, each cylinder 30, 32 has an axial centerline CL that is, in one embodiment, coaxial with that of the other cylinder. Furthermore, housing 28 is, in one embodiment, constructed of a magnetically permeable material, such as stainless steel, and pistons 34, 36 are optimally constructed of a magnetically indifferent material, such as plastic or ceramic.

In the embodiment of exemplary linear compressor 120 shown in FIG. 2, each piston 34, 36 is driven within its respective cylinder 30, 32 by linear motor 40. Each motor 40 includes a ring-shaped permanent magnet 42 and an associated electrical coil 44. In the embodiment of an exemplary linear compressor 120 shown in FIG. 2, magnet 42 is mounted within housing 28 and coil 44 is wound upon a portion of piston 34, 36. In one embodiment, magnet 42 is radially charged, and each motor 40 includes a cylindrical core 46 mounted within housing 28 adjacent magnet 42 to direct the flux lines (not shown) from magnet 42 across coil 44. In one embodiment, coil 44 is energized by an AC current, from drive circuit 26 (FIG. 1), over a corresponding lead wire (not shown). In one embodiment of the invention, drive circuit 26 is programmed such that, when the AC current is applied to coils 44 (FIG. 2), pistons 34, 36 will reciprocate toward and away from each other along the axial centerline CL of cylinders 30, 32. In another embodiment, DC current is applied. In one embodiment, spring 48, or similar means, may be connected between each piston 34, 36 and adjacent end plate 38 to aid in matching the natural frequency of piston 34, 36 to the frequency of the current from drive circuit 26 (FIG. 1).

The embodiment of an exemplary linear compressor 120 shown in FIG. 2 also includes a compression chamber 50 located within cylinders 30, 32, between pistons 34, 36. During the expansion portion of each operating cycle of linear compressor 120, motors 40 will move pistons 34, 36 away from each other. This will cause the then gaseous refrigerant within evaporator 20 (FIG. 1) to be drawn into compression chamber 50 (FIG. 2), through an inlet port 52 in housing 28. During the successive compression portion of the operating cycle of exemplary linear compressor 120, motors 40 will move pistons 34, 36 toward each other. Pistons 34, 36 will consequently compress the then gaseous refrigerant within compression chamber 50 into a liquid and eject it into condenser 14 (FIG. 1), through an outlet port 54 (FIG. 2) in housing 28. In one embodiment, suitable check valves 56, 58 are provided in inlet and outlet ports 52, 54, respectively, to control the flow of refrigerant through inlet and outlet ports 52, 54 during the expansion and compression portions of each operating cycle.

While a specific embodiment of a field replaceable packaged refrigeration heat sink module 10 is discussed above that includes exemplary linear compressor 120, those of skill in the art will recognize that the choice of a linear compressor, or any particular compressor, for use as compressor 12 in the discussion above was made for illustration simplicity and to avoid detracting from the invention by describing multiple specific embodiments at one time. In other embodiments of the invention appropriately sized rotary compressor, or other type of compressor, can be used as compressor 12. For instance, in various embodiments of the invention, compressor 12 can be: a reciprocating compressor; a Swash-plate compressor; a rolling piston compressor; a scroll compressor; a rotary vane compressor; a screw compressor; an aerodynamic-turbo compressor; an aerodynamic-axial compressor; or any other reciprocating, volumetric or aerodynamic compressor known in the art, or developed after this application is filed. Consequently, the present invention should not be read as being limited the particular embodiments discussed above using linear, or any specific, compressor types.

Consequently, the present invention should not be read as being limited the particular embodiments discussed above using linear, or any specific, compressor types.

According to the principles of the invention, field replaceable packaged refrigeration heat sink module 10 can be readily adapted for use in cooling one or more integrated circuits that are mounted on a single circuit board and are part of a larger electronic system. For example, in many computer servers a number of integrated circuits are mounted on a single circuit board that, in turn, is housed within an enclosure/cabinet or "rack unit", and a number of such rack units are, in turn, mounted in corresponding racks that are supported in the housing of the server.

In accordance with one industry standard, each rack unit has a height of only 1.75 inches. This fact makes use of prior art liquid-based cooling systems extremely difficult, if not impossible, and makes the extensive, and potentially disastrous, plumbing, discussed above, a system requirement. In contrast, a single, or even multiple, field replaceable packaged refrigeration heat sink modules 10, designed according to the principles of the invention, can be positioned within the housing of the server, and/or on the rack units, to directly cool the integrated circuits that are located within or on the rack units. Consequently, in one embodiment of the invention, field replaceable packaged refrigeration heat sink modules 10, designed according to the invention, are housed within a small scale cooling unit that can be located within each rack unit and connected directly to cool each integrated circuit as needed.

Figure 3:
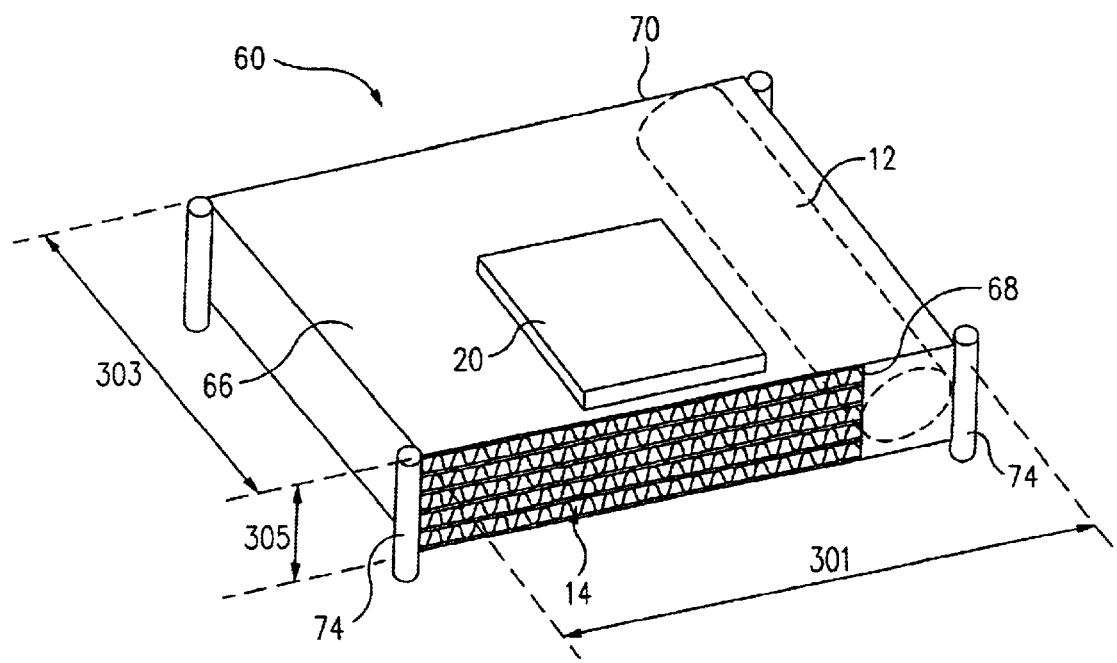
FIG. 3 is a perspective view of a field replaceable packaged refrigeration heat sink module designed according to the principles of one embodiment of the invention.
Figure 4:
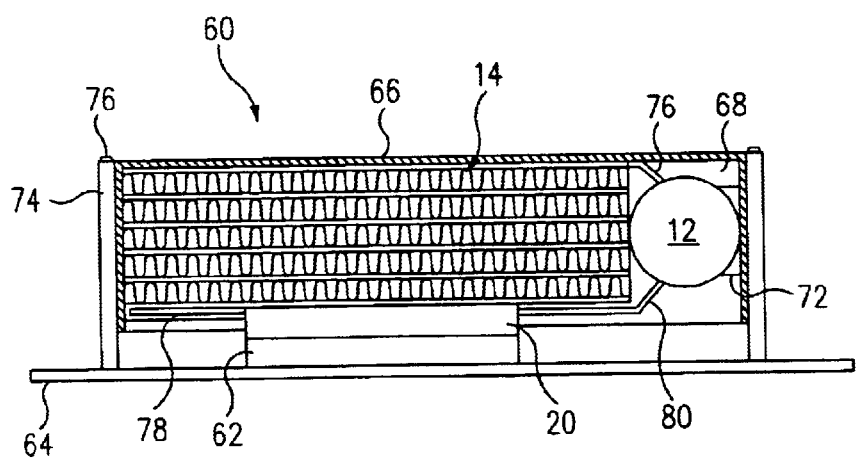
FIG. 4 is cross sectional view of the field replaceable packaged refrigeration heat sink module of FIG. 3 shown mounted on an exemplary electrical component according to the principles of one embodiment of the invention.
Figure 5:
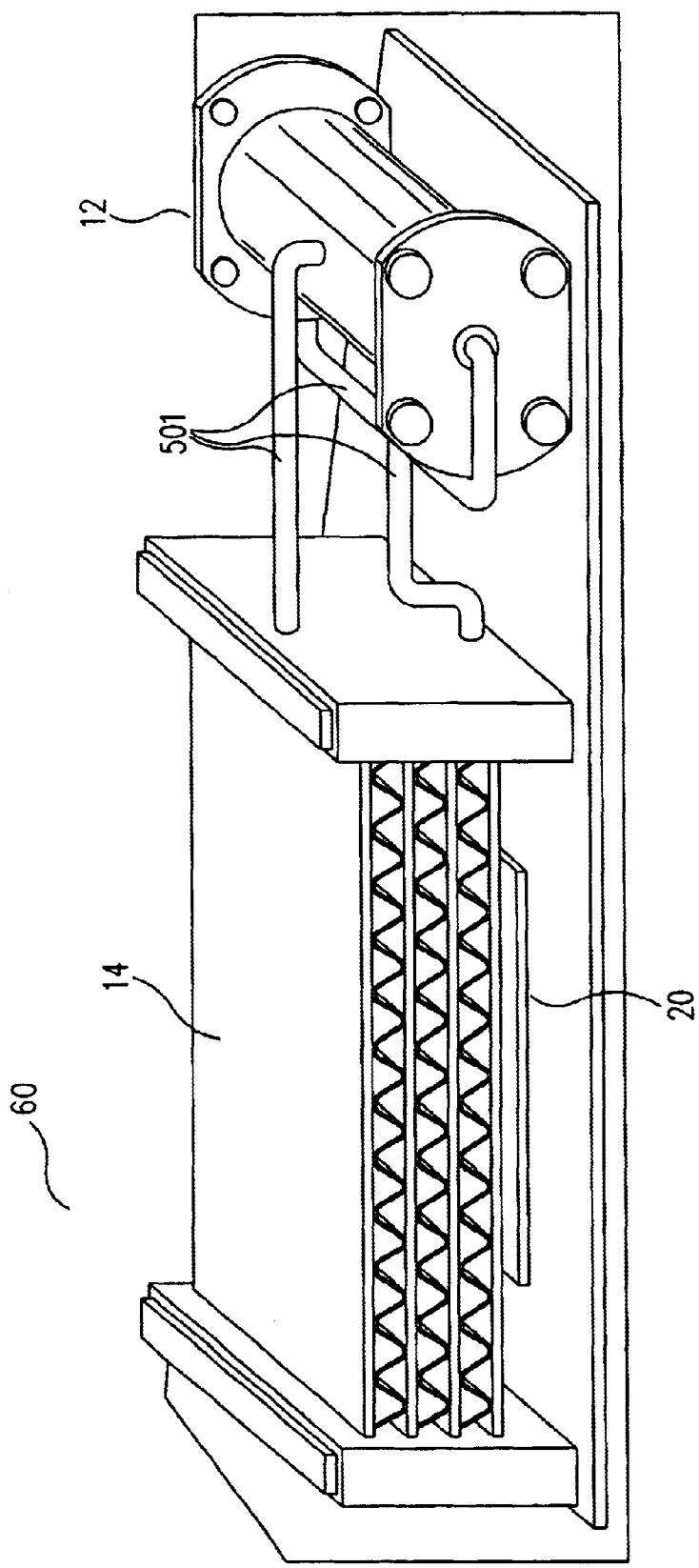
FIG. 5 is a computer-generated representation of one embodiment of the field replaceable packaged refrigeration heat sink module of FIG. 3 according to the principles of one embodiment of the invention.

One example of a physical implementation of the functional diagram of a field replaceable packaged refrigeration heat sink module 10 of FIG. 1 is shown as field replaceable packaged refrigeration heat sink module 60 of FIG. 3, FIG. 4 and FIG. 5. As shown in FIGS. 3 and 4, according to one embodiment of the invention, field replaceable packaged refrigeration heat sink module 60 is positioned adjacent an integrated circuit 62 that is mounted on a circuit board 64. As discussed above, in accordance with one embodiment of the invention, field replaceable packaged refrigeration heat sink module 60 is sized such that, when positioned as shown in FIG. 4, field replaceable packaged refrigeration heat sink module 60 will fit within a rack unit of a conventional computer server or a telecommunications rack. In one embodiment of the invention, field replaceable packaged refrigeration heat sink module 60 has a length 301 (FIG. 3) of approximately 6 inches, a width 303 of approximately 4 inches, and a height 305 of approximately 1.75 inches. In another embodiment of the invention, field replaceable packaged refrigeration heat sink module 60 has a length 301 of approximately 5 inches, a width 303 of approximately 4 inches, and a height 305 of approximately 1.75 inches. Of course, those of skill in the art will recognize that length 301, width 303 and height 305 of field replaceable packaged refrigeration heat sink module 60 can be varied to meet the needs of specific applications.

As shown in FIG. 3, in one embodiment of the invention, field replaceable packaged refrigeration heat sink module 60 includes a housing 66 which has generally open front and back sides 68, 70, a conventional air-cooled condenser 14, which is mounted within housing 66 between open front and back sides 68, 70, a compressor 12 which is connected to housing 66 by a suitable bracket 72, and an evaporator 20 which is connected to housing 66, below condenser 14. As discussed above, in one embodiment of the invention, compressor 12 is a linear compressor driven by a drive circuit (not shown) in a manner similar to that discussed above. In one embodiment of the invention, evaporator 20 is a conventional cold plate-type evaporator that is thermally coupled to the top of integrated circuit 62 (FIG. 4) by conventional means. In one embodiment of the invention, condenser 14 is cooled by a flow of air from a system fan (not shown) that is mounted in the housing (not shown) of the server (not shown). In addition, in one embodiment of the invention, field replaceable packaged refrigeration heat sink module 60 is connected to circuit board 64 with a number of standoffs 74 and screws 76.

During the normal operation of field replaceable packaged refrigeration heat sink module 60, relatively high-pressure liquid refrigerant from compressor 12 is conveyed through a conduit 76 to condenser 14. In one embodiment of the invention, the high-pressure liquid refrigerant is cooled in condenser 14 by the flow of air from a system fan (not shown). The refrigerant is then conveyed through a capillary tube 78 to evaporator 20. The refrigerant evaporates in evaporator 20 and in the process absorbs heat from integrated circuit 62 to thereby cool integrated circuit 62 (FIG. 4). The now gaseous refrigerant is then drawn back into compressor 12 through conduit 80. This cycle is then repeated as required to produce a desired cooling effect for integrated circuit 62.

FIG. 5 is a computer-generated representation of one embodiment of field replaceable packaged refrigeration heat sink module 60 of FIG. 3 and FIG. 4 and therefore represents a computer-generated representation of a physical implementation of the functional diagram of field replaceable packaged refrigeration heat sink module 10 of FIG. 1. Shown in FIG. 5 are: condenser 14; compressor 12; evaporator 20; and tubing 501. It is worth noting that tubing 501 is relatively minimal and, is therefore, a substantial improvement over the extensive "plumbing" associated with prior art liquid-based cooling systems. Indeed, unlike prior art liquid-based cooling systems, the various parts of field replaceable packaged refrigeration heat sink module 60 of the invention, including the very minimal tubing 501, are self-contained in field replaceable packaged refrigeration heat sink module 60 and therefore a failure of any of the tubes 501 would typically not result in the introduction of liquid into or onto the electronic devices (62 in FIG. 4) and would not cause the catastrophic system failure that was the risk associated with prior art liquid-based cooling systems.

As discussed above, the present invention is directed to a field and/or customer replaceable packaged refrigeration heat sink module that is suitable for use in standard electronic component environments. The present invention takes advantage of recent advances in compressor technology to provide a truly field replaceable packaged refrigeration heat sink module. The field replaceable packaged refrigeration heat sink module of the present invention is self-contained and is specifically designed to have physical dimensions similar to those of a standard air-based cooling system, such as a fined heat sink or heat pipe. As a result, the present invention can be utilized in existing electronic systems without the need for board or rack/cabinet modification or the "plumbing" associated with prior art liquid-based cooling systems. Indeed, unlike prior art liquid-based cooling systems, the various parts of the field replaceable packaged refrigeration heat sink module of the invention, including the very minimal tubing, are self-contained in the field replaceable packaged refrigeration heat sink module and therefore a failure of any of the tubes would typically not result in the introduction of liquid into, or onto, the electronic devices being cooled.

In addition, since the field replaceable packaged refrigeration heat sink module of the invention is a modified liquid-based cooling system, the field replaceable packaged refrigeration heat sink module of the invention provides the cooling capacity of prior art liquid-based cooling systems. However, like prior art air-based cooling systems, the field replaceable packaged refrigeration heat sink module of the invention is modular and self-contained and is therefore field and/or customer replaceable with minimal effort using standard tools. In addition, like prior art air-based cooling systems, the field replaceable packaged refrigeration heat sink module of the invention is, in one embodiment, attached directly to the components that need cooling and a discrete field replaceable packaged refrigeration heat sink module of the invention can be provided for each heat source. In addition, like prior art air-based cooling systems, the field replaceable packaged refrigeration heat sink module of the invention is compact and simple in both operation and installation, with minimal parts to fail or break and minimal added complexity. Therefore, unlike prior art liquid-based cooling systems, the field replaceable packaged refrigeration heat sink module of the invention is very sturdy and very reliable.

In addition, the field replaceable packaged refrigeration heat sink module of the present invention is self contained and specifically designed to be operational in any orientation. Consequently, unlike prior art liquid-based cooling systems, the field replaceable packaged refrigeration heat sink module of the present invention can be mounted, and operated, at any angle. This makes the field replaceable packaged refrigeration heat sink module of the present invention particularly well suited for use with electronic systems.

As a result of the features of the present invention discussed in detail above, the field replaceable packaged refrigeration heat sink module of the present invention provides the cooling capacity of a liquid-based cooling system and yet is modular, compact, simple in design, and simple to use, like an air-based cooling system. Consequently, the field replaceable packaged refrigeration heat sink module of the present invention can meet the cooling needs of the next generation of electronic devices and systems and can make further speed and device density improvements in microprocessor design a workable possibility.

It should be recognized that, while the present invention has been described in relation to the specific embodiments thereof discussed above, those skilled in the art may develop a wide variation of structural and operational details without departing from the principles of the invention.

As one example, the choice of a linear compressor, or any particular linear compressor, for use as compressor 12 in the discussion above was made for illustration simplicity and to avoid detracting from the invention by describing multiple specific embodiments at one time. In other embodiments of the invention, appropriately sized rotary compressors, or other compressors, can be used as compressor 12. For instance, in various embodiments of the invention, compressor 12 can be: a reciprocating compressor; a Swash-plate compressor; a rolling piston compressor; a scroll compressor; a rotary vane compressor; a screw compressor; an aerodynamic-turbo compressor; an aerodynamic-axial compressor; or any other reciprocating, volumetric or aerodynamic compressor known in the art, or developed after this application is filed. Consequently, the present invention should not be read as being limited the particular embodiments discussed above using linear, or any specific, compressor types.

As another example, specific dimensions were discussed above as examples of possible values for length 301, width 303 and height 305 of field replaceable packaged refrigeration heat sink module 60. Those of skill in the art will recognize that length 301, width 303 and height 305 of field replaceable packaged refrigeration heat sink module 60 can be varied for specific applications and that the present invention should not be read as being limited the particular embodiments discussed above with the particular dimensions discussed by way of illustration.

What is claimed is:

1. A packaged refrigeration heat sink module for cooling electronic components, said packaged refrigeration heat sink module comprising:

a packaged refrigeration heat sink module housing;

refrigerant;

a compressor;

a condenser;

an expansion device; and an evaporator; wherein, said compressor, said condenser, said expansion device and said evaporator are coupled together in a refrigeration loop within said packaged refrigeration heat sink module housing and said refrigerant is contained within said refrigeration loop such that said packaged refrigeration heat sink module is a self-contained module; wherein, said packaged refrigeration heat sink module has a width of approximately 4 inches, a length of approximately 5 inches and a height of approximately 1.75 inches.

2. The packaged refrigeration heat sink module of claim 1; wherein, said compressor is a single piston linear compressor.

3. The packaged refrigeration heat sink module of claim 1; wherein, said compressor is a dual-piston linear compressor.

4. The packaged refrigeration heat sink module of claim 1; wherein, said compressor is a multi-piston linear compressor.

5. The packaged refrigeration heat sink module of claim 1; wherein, said compressor is a rotary compressor.

6. The packaged refrigeration heat sink module of claim 1; wherein, said compressor is a reciprocating compressor.

7. The packaged refrigeration heat sink module of claim 1; wherein, said compressor is a rolling piston compressor.

8. The packaged refrigeration heat sink module of claim 1; wherein, said compressor is a rotary vane compressor.

9. The packaged refrigeration heat sink module of claim 1; wherein, said compressor is a screw compressor.

10. The packaged refrigeration heat sink module of claim 1; wherein, said compressor is a Swash-plate compressor.

11. The packaged refrigeration heat sink module of claim 1; wherein, said compressor is a scroll compressor.

12. A circuit board, said circuit board comprising:
at least one electronic component; and
a packaged refrigeration heat sink module for cooling said electronic component, said packaged refrigeration heat sink module comprising:
a packaged refrigeration heat sink module housing;
refrigerant;
a compressor;
a condenser;
an expansion device; and
an evaporator; wherein,
said compressor, said condenser, said expansion device and said evaporator are coupled together in a refrigeration loop within said packaged refrigeration heat sink module housing and said refrigerant is contained within said refrigeration loop such that said packaged refrigeration heat sink module is a self-contained module; further wherein,
said packaged refrigeration heat sink module is mounted directly over a first surface of said electronic component; wherein,
said packaged refrigeration heat sink module has a width of approximately 4 inches, a length of approximately 5 inches and a height of approximately 1.75 inches.

13. The circuit board of claim 12; wherein, said compressor is a single piston linear compressor.

14. The circuit board of claim 12; wherein, said compressor is a dual-piston linear compressor.

15. The circuit board of claim 12; wherein, said compressor is a multi-piston linear compressor.

16. The circuit board of claim 12; wherein, said compressor is a rotary compressor.

17. The circuit board of claim 12; wherein, said compressor is a reciprocating compressor.

18. The circuit board of claim 12; wherein, said compressor is a rolling piston compressor.

19. The circuit board of claim 12; wherein, said compressor is a rotary vane compressor.

20. The circuit board of claim 12; wherein, said compressor is a screw compressor.

21. The circuit board of claim 12; wherein, said compressor is a Swash-plate compressor.

22. The circuit board of claim 12; wherein, said compressor is a scroll compressor.

23. The circuit board of claim 12; wherein, said electronic component is an integrated circuit.

24. The circuit board of claim 12; wherein, said electronic component is a microprocessor.

25. An electronic system, said electronic system comprising:
a rack unit, said rack unit comprising:
at least one electronic component; and
a packaged refrigeration heat sink module for cooling said electronic component, said packaged refrigeration heat sink module comprising:
a packaged refrigeration heat sink module housing;
refrigerant;
a compressor;
a condenser;
an expansion device; and
an evaporator; wherein,
said compressor, said condenser, said expansion device and said evaporator are coupled together in a refrigeration loop within said packaged refrigeration heat sink module housing and said refrigerant is contained within said refrigeration loop such that said packaged refrigeration heat sink module is a self-contained module; wherein,
said packaged refrigeration heat sink module has a width of approximately 4 inches, a length of approximately 5 inches and a height of approximately 1.75 inches.

26. The electronic system of claim 25; wherein, said compressor is a single piston linear compressor.

27. The electronic system of claim 25; wherein, said compressor is a dual-piston linear compressor.

28. The electronic system of claim 25; wherein, said compressor is a multi-piston linear compressor.

29. The electronic system of claim 25; wherein, said compressor is a rotary compressor.

30. The electronic system of claim 25; wherein, said compressor is a reciprocating compressor.

31. The electronic system of claim 25; wherein, said compressor is a rolling piston compressor.

32. The electronic system of claim 25; wherein, said compressor is a rotary vane compressor.

33. The electronic system of claim 25; wherein, said compressor is a screw compressor.

34. The electronic system of claim 25; wherein, said compressor is a Swash-plate compressor.

35. The electronic system of claim 25; wherein, said compressor is a scroll compressor.

36. The electronic system of claim 25; wherein, said electronic component is an integrated circuit.

37. The electronic system of claim 25; wherein, said electronic component is a microprocessor.

* * * * *